United States Patent [19]

Horaguchi et al.

[11] Patent Number: 4,924,255
[45] Date of Patent: May 8, 1990

[54] EXPOSURE UNIT IN AN IMAGE RECORDING APPARATUS

[75] Inventors: Yoichi Horaguchi, Nagoya; Kenji Sakakibara, Ichinomiya; Makoto Yamada, Gifu; Osamu Nagata, Aichi; Tsuyoshi Suzuki; Toshio Sugiura, both of Nagoya, all of Japan

[73] Assignee: Brother Kogyo Kabushiki Kaisha, Japan

[21] Appl. No.: 284,895

[22] Filed: Dec. 15, 1988

[30] Foreign Application Priority Data

Dec. 18, 1987 [JP] Japan .......................... 62-193086[U]
Jan. 29, 1988 [JP] Japan .................................. 63-20986
Apr. 1, 1988 [JP] Japan ............................. 63-45167[U]

[51] Int. Cl.$^5$ ...................... G03B 27/32; G03B 27/52
[52] U.S. Cl. ...................................... 355/27; 355/32; 355/35
[58] Field of Search .................. 355/32, 35, 36, 27; 430/138; 354/301, 302, 297

[56] References Cited

U.S. PATENT DOCUMENTS

| 3,775,006 | 11/1973 | Hartman et al. | 355/4 |
| 3,923,393 | 12/1975 | Inoue et al. | 355/35 |
| 4,603,969 | 8/1986 | Terashita | 355/77 |
| 4,746,955 | 5/1988 | Slayton et al. | 355/35 |

FOREIGN PATENT DOCUMENTS

| 82/01082 | 4/1982 | European Pat. Off. |
| 1009346 | 11/1965 | United Kingdom. |
| 1303511 | 1/1973 | United Kingdom. |
| 2049970 | 12/1980 | United Kingdom. |
| 2084747 | 4/1982 | United Kingdom. |

Primary Examiner—Richard A. Wintercorn
Attorney, Agent, or Firm—Oliff & Berridge

[57] ABSTRACT

In order to adjust light components, there is provided a filter unit which includes a light source for emitting a light, a filter housing to which an opening is formed; and three filters arranged in vertical direction within the filter housing and adapted to be drawn from the opening. Each of the three filters adjusts one of red, blue and green components contained in the light. A drive unit is further included in the filter housing which selectively draws the three filters from the opening to an optical path. Accordingly, the light components can be adequately adjusted by drawing the filters in the optical path. By the employment of such a filter unit in a color image recording apparatus, the color tone of the image reproduced in a copy sheet can be adjusted.

16 Claims, 7 Drawing Sheets

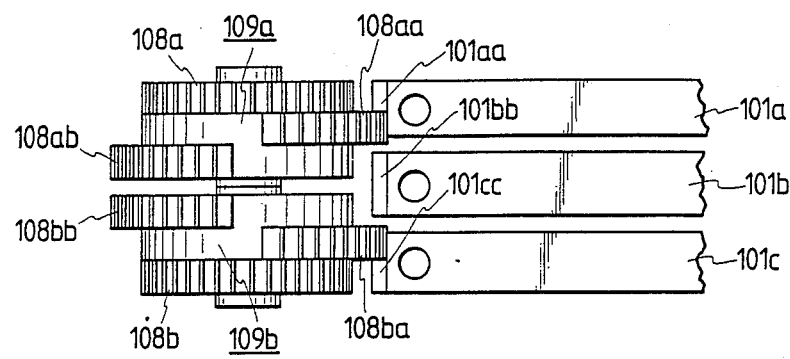
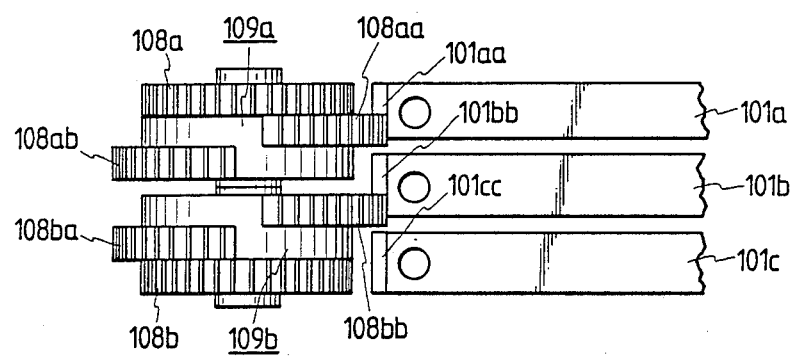
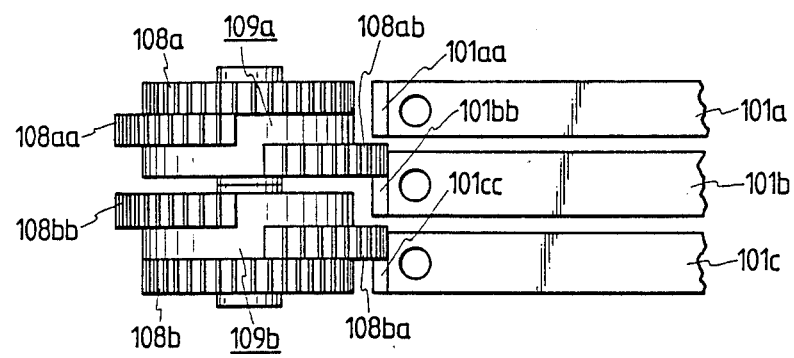

EXPOSURE UNIT IN AN IMAGE RECORDING APPARATUS

BACKGROUND OF THE INVENTION

The present invention relates to an exposure unit in an image recording apparatus, and more particularly to such an exposure unit for exposing a photosensitive pressure-sensitive recording medium to an image bearing light to form a latent image thereon. The latent image formed thereon is developed under pressure to thus provide a copied sheet.

Conventionally, image recording apparatuses have been known in the art. Some of such recording apparatuses use a transfer type recording medium described, for example, in U.S. Pat. No. 4,339,209. Generally, the transfer type image recording medium comprises a microcapsule sheet (first image recording medium) and a developer sheet (second image recording medium). The first image recording medium comprises a photosensitive pressure-sensitive recording medium provided with pressure rupturable microcapsules which encapsulate therein a first material (chromogenic material or dye precursor) having first and second phase dependent on light exposure. The second image recording medium comprises the developer medium provided with a second material (developer material) which provides an output image upon reaction with the first material. More specifically, in the first image recording medium, there are provided three kinds of microcapsules each encapsulating therein a chromogenic material of one of three primary colors; cyan, magenta and yellow. The cyan microcapsule contains a cyan chromogenic material as a primary component, a photo-curing (or photo-softening), resin, a photosensitizer, a photopolymerization initiator. The magenta and yellow microcapsules also contain the same components as those of the cyan microcapsule, but the cyan chromogenic material is replaced by magenta and yellow chromogenic materials, respectively.

In the image recording apparatus using the above-described recording medium, when exposure is taken place for the first medium, i.e. photosensitive pressure-sensitive recording medium, a filter unit is required to adjust color tone of the output image. This is partly because the sensitivities of the microcapsules to light differ depending upon the kinds of the microcapsules and partly because a light source for irradiating light onto an original has variations in light distribution. Furthermore, preference of color tone balance differs depending upon individuals, and one may want to adjust the color tone balance in the output image.

A conventional filter unit is disposed in such a manner that a filter is stretched perpendicular to an optical path to allow the entire cross-section of the light pass therethrough. Therefore, the color tone is not continuously adjustable and it is necessary to replace the filter when a different color adjustment is desired.

Another conventional filter unit has been known in which two filters are contained. Either one or both of the two filters are selectively inserted into the optical path by driving each associated drive source. Two light components of three primary colors of light are adjustable by those two filters relative to the remaining one primary color as a reference. In such a filter unit, however, the color adjustment cannot be adequately performed with respect to photosensitive pressure-sensitive recording mediums which have different characteristics in light sensitivity.

A still another conventional filter unit has been known in which two filters are contained and arranged to be horizontally movable. Each filter has two filter segments of different colors with a transparent region interposed therebetween, and one of the two filter segments in the respective filters are of the same color. The two filters are initially disposed in the optical path so that the light passes through the transparent regions. To adjust the color tone, the filters are individually horizontally moved to either of the directions so that two out of three primary colors are appropriately adjustable. However, such a filter unit is not efficient in that the two filters have the same type of the filter segments. Further, the size of the filter is enlarged du to the provision of two kinds of filter segments thereon, causing an increase in the overall size of the recording apparatus.

SUMMARY OF THE INVENTION

In light of the foregoing, it is an object of the present invention to provide a filter unit for use in an image recording apparatus in which a color tone of an output image on a copy sheet is precisely adjustable.

It is another object of the invention to provide a filter unit which can be made in compact size.

In order to achieve the above and other objects, there is provided an exposure unit for use in an image recording apparatus for exposing a substrate to a light, said exposure unit comprising:

a filter unit for receiving a first light passing along an optical path and adjusting light components contained in said first light, said filter unit including:
  (a) a light source for emitting said first light;
  (b) a filter housing to which an opening is formed;
  (c) a first filter member for adjusting a red-color light component;
  (d) a second filter member for adjusting a blue-color light component; and
  (e) a third filter member for adjusting a green-color light component, wherein said first, second and third filter members are retained in said filter housing and adapted to be draw in from said opening, and a drive unit for selectively drawing said first, second and third filter members from said opening into the optical path.

In further accordance with the present invention, there is provided an image recording apparatus for recording an image of an original on an image recording medium having an imaging surface capable of forming a latent image thereon when exposed to light, said apparatus comprising:

a light source for emitting light;

an original support unit for supporting said original so as to be irradiated by the light emitted from said light source, said original support unit being movable at a predetermined speed so that the image of said original is sequentially scanned by the light, the light irradiated onto said original being reflected from said original and providing an image bearing light passing along an optical path;

a conveying unit for conveying said image recording medium along a conveyance path;

an exposure unit having an exposure zone along which said image recording medium is conveyed wherein said image bearing light is applied to said image recording medium to form a latent image thereon; wherein said exposure unit comprises:

(a) a filter unit for receiving said image bearing light and adjusting light components contained in said image bearing light, said filter unit having a filter housing to which an opening is formed, a first filter member for adjusting a red-color light component, a second filter member for adjusting a blue-color light, and a third filter member for adjusting a green-color light component, said first, second and third filter members being retained in said filter housing and adapted to be drawn from said opening; a drive unit for selectively drawing said filter members from said opening into the optical path; and (b) a lens unit for receiving the image bearing light and focusing the latter light;

a developing unit disposed downstream of said exposure unit and having a developing zone for developing said latent image and providing a visible image; and a drive unit for selectively drawing said first, second and third filter members from said opening into the optical path.

BRIEF DESCRIPTION OF THE DRAWING

In the drawings:

FIGS. 8A through 8C are vertical views showing various driving statuses of the driving system shown in FIG. 7;

DETAILED DESCRIPTION OF THE PREFERRED EMBODIMENTS

Figure 1:
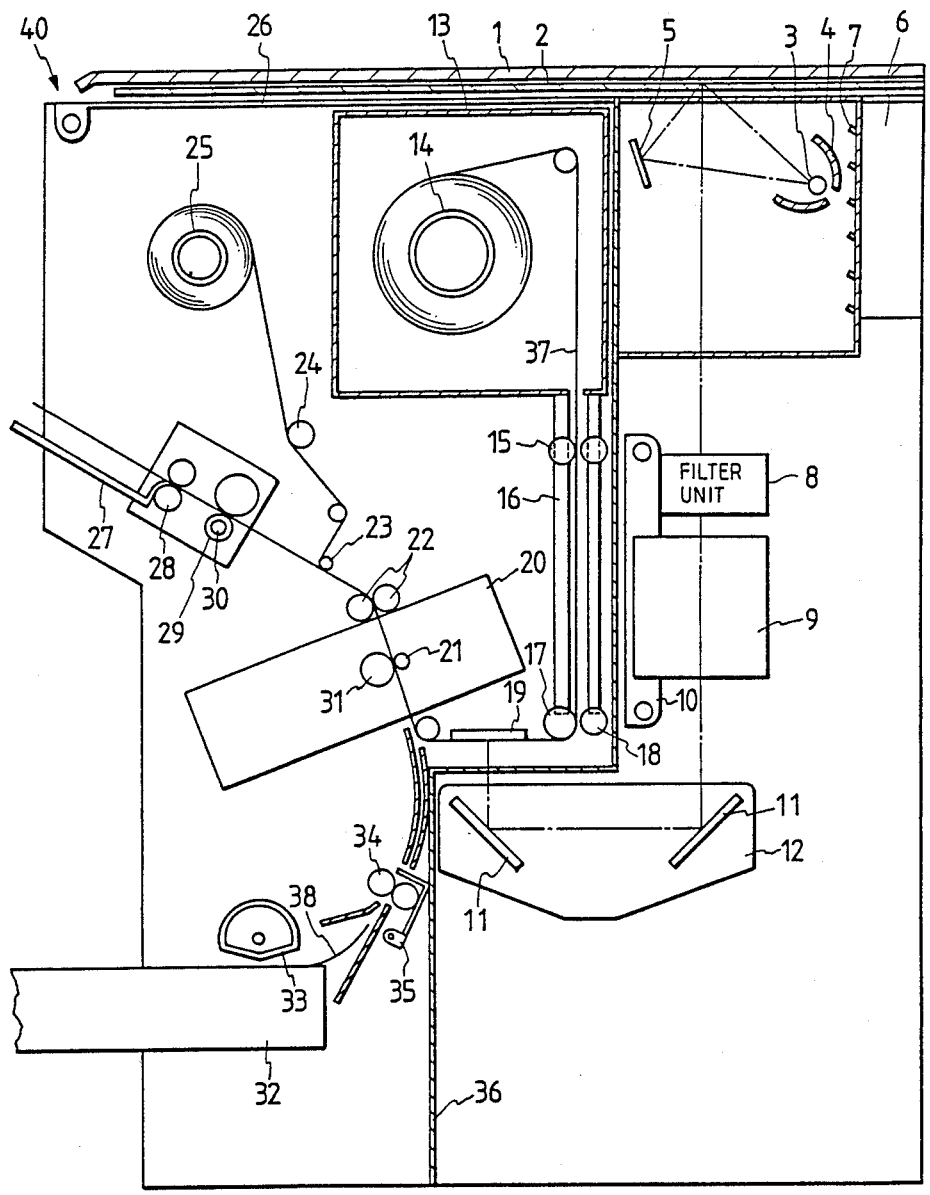
FIG. 1 is a schematic elevational view showing a first image recording apparatus to which an exposure unit of the present invention is applied.

Referring to FIG. 1, an image recording apparatus according to the present invention will be described.

FIG. 1 shows an image recording apparatus capable of performing a full-color copying. This apparatus employs a transfer type image recording mediums as described in U.S. Pat. No. 4,399,209.

As shown in FIG. 1, the apparatus 40 generally includes an exposure unit and a pressure developing unit 20. The exposure unit includes an exposure stand 19. An exposure zone of the exposure unit is positioned closely adjacent to the pressure developing unit 20 as shown. This adjacent position relationship is advantageous in that a length of a non-treated or margin section of an elongated web-like microcapsule sheet 37, the margin being positioned between a leading pressure developing section of the sheet 37 and the following exposure section thereof, can be minimized, so that the sheet 37 is efficiently used.

Further, a light shielding partition plate 36 is disposed in the apparatus to divide internal space of the apparatus into two chambers. That is, an optical system briding from the light source to the exposure unit is disposed within one chamber whereas other requisite units such as the pressure developing and thermal fixing units are disposed within another chamber.

The microcapsule sheet 37 is wound around cartridge shaft 14, and is retained in a microcapsule sheet cartridge 13 that is detachably disposed at a position immediately below an original support stand glass 2 and is formed with a bottom opening. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed rollers 15, a barrel roller 17 and a guide roller 18 are rotatably provided at a vertical sheet path for guiding and transporting the sheet toward the exposure unit. At the downstream side of the exposure unit 19, there is provided the pressure developing unit 20 which includes a small-diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed the uppermost developer sheet 38 toward the pressure developing unit 20. Between the cassette 32 and the pressure developing unit 20, a roller 34 and a register gate 35 are provided so as to register leading edge of the developer sheet 38.

At downstream side of the pressure developing unit 20, a pair of feed rollers 22 are provided so as to feed the sheets fed out from the developing unit 20 at a given speed. The downstream side of the feed rollers 22, a separation roller 23 is provided at which the microcapsule sheet 37 is separated from the developer sheet 37. The separated microcapsule sheet 37 is taken-up by the above mentioned take-up shaft 25 through a meander travel control roller 24. On the other hand, a thermal fixing unit 30 is provided at the downstream side of the separation roller 23. The thermal fixing unit 30 includes a hollow heat roller 29 into which a heater element 30 is disposed. Further, a developer sheet feed roller 28 is provided to feed the image fixed developer sheet 38 toward a discharge tray 27.

Next, an optical system and optical path in the recording apparatus 40 will be described. As shown, the copying machine 40 has its top plate portion provided with a stand cover 1 and the original support stand glass 2. The original support stand glass 2 is made of a light transmissive material and is movable in the horizontal direction and on which a desired original (not shown) is placed with image face down. At the upper one side section (right side in FIG. 1), fixedly provided is a light source including a linear-shaped halogen lamp 3 extending in the direction perpendicular to the moving direction of the original support stand glass 2, and a semi-cylindrical reflector 4 disposed to surround the lamp 3. The light source emits a linear-line light ray to the original support stand glass 2.

Therefore, the light emitted from the halogen lamp 3 is sequentially irradiated onto the entire surface over the region from the one to the other ends of the original support stand glass 2 in accordance with the horizontal movement of the glass 2. The light from the light source passes through the transparent original support stand glass 2 and is reflected upon the original mounted thereon. The original support stand cover 1 which covers the top surface of the glass 2 is provided in order to prevent this light from leakage out of the apparatus.

To irradiate the light from the halogen lamp 3 onto the original at a high efficiency, a flat reflector 5 is disposed on one side of the light source. The flat reflector 5 is disposed to directed scattered light toward the original and concentrate such reflected light onto the original.

At the rear side of the halogen lamp 3 there are provided a fan 6 and a louver 7 for introducing an external air into the apparatus. Accordingly, air is effectively impinged onto the light source to cool the same.

A filter unit 8 is disposed below the light source unit. A lens unit 9 is provided further below the filter unit 8. Light emitted from the halogen lamp 3 and reflected upon the original passes through the filter unit 8 and enters the lens 9. The filter unit 8 alters the light transmissive characteristic in accordance with the sensitivity characteristics of the microcapsule sheet 37, to thereby adjust the color tone of a copied output image. The lens 9 is fixedly secured to a lens mounting plate 10, and fine angular adjustment of this lens with respect to a light path can be achieved by adjusting the position of the plate 10.

A pair of reflection mirrors 11 are provided below the lens 9. The lights having passed through the lens 9 change their direction by 180 degrees (completely reverse direction) by the two reflection mirrors 11, and the thus oriented lights are applied to the microcapsule sheet 37 closely contacting the lower surface of the exposure table 19 to form the latent image thereon. The two reflection mirrors 11 are securely mounted on a plate 12. The mirror mounting plate 12 is fixedly secured to a main frame (not shown) of the apparatus 40, so that the adjustment of the length of the light path and focusing adjustment can be effected by fine adjustment of the position of the mirror mounting plate 12. The original (not shown), the filter unit 8, the lens 9, the pair of reflection mirrors 11 and the exposure table 19 define a U-shape or J-shape light path in combination. That is, the optical path is bent into U-shape or J-shape so as to have a first vertical path directed downwardly, a second path directed horizontally and a third path directed upwardly. At the first optical path, a light reflected from the original is oriented downwardly, and at the third path the reflected light is directed toward the imaging surface of the microcapsule sheet 37 at the exposure zone, and the reflection mirror unit is disposed at the second optical path extending in horizontal direction. As a result, the mirror mounting plate 12 is adjustably movable in a direction parallel to the light path passing through the lens 9. Further, when the mirror mounting plate 12 is vertically moved by a certain distance, the total light path distance is increased by a distance twice as long as the certain distance, yet the focussing position at the exposure zone is maintained unchanged, since these mirrors can be moved in a direction parallel to the optical axis.

Operation of the copying apparatus thus constructed will be described.

The microcapsule sheet 37 taken out from the opening of the cartridge 13 is fed by the feed rollers 15 and guided by the rollers 17 and 18. By rotation of the feed rollers 15, the sheet 37 is conveyed into the exposure unit while contacting a lower face of the exposure table 19 where original image carrying light is applied to the sheet 37, so that a latent image is formed on the sheet 37.

More specifically, the original support stand cover 1 is lifted up for mounting the original on the original support stand glass 2. Then, when a start button (not shown) is depressed, the original support stand glass 2 is moved rightwardly to a position where the leftmost edge of the glass 2 is irradiated by the light from the light source 3. The original support stand glass 2 is then moved leftwardly at a first moving speed V1 while being irradiated by the light from the halogen lamp 3. The light emitted from the halogen lamp 3 is reflected upon the original, and the reflected light passes through the filter unit 8 and lens 9 and is reflected upon two reflection mirrors 11. The last reflected light is finally directed toward the microcapsule sheet 37 which is supported on the lower surface of the exposure table 19 to form the latent image on the sheet 37. At this time, the microcapsule sheet 37 is moved leftwardly through the exposure unit at a second moving speed V2 (V2=n·V1) where n represents a magnification/reduction factor. That is, the second speed V2 is the first moving speed V1 multiplied by the factor n. When the factor n is greater than 1 (one), the microcapsule sheet 37 is moved faster than the first moving sheet V1 or the scanning speed, so that an enlarged size latent image is formed thereon in comparison with the size of the image on the original. On the other hand, when the factor n is smaller than 1 (one) the microcapsule sheet 37 is moved slower than the scanning speed, so that a reduced size latent image is formed thereon. When the factor n is equal to 1 (one), i.e. the microcapsule sheet 37 is moved at the same speed as the scanning speed and an equi-size latent image is formed thereon. The change of the second speed V2 with respect to the first speed V1 causes enlargement or reduction in the size of the original image only in the scanning direction. It should be noted, however, that the enlargement or reduction of the original image in the widthwise direction thereof is accomplished by the lens 9 so as to agree with the enlargement or reduction in the direction of scanning.

The sheet 37 is then fed into the pressure developing unit 20. The developer sheets 38 are fed out one by one by the sector or woodruff roller 33 in timed relation to the feeding of the sheet 37, and both sheets are fed to a sheet inlet of the pressure developing unit 20 after leading edge of the sheet 38 is registered by developer sheet rollers 34 and the register gate 35. At the pressure developing unit 20, the microcapsule-carrying surface of the microcapsule sheet 37 on which a latent image is formed is in facial contact with the developer-coated surface of the developer sheet 38 at a position inside the pressure developing unit 20, and these superposed sheets are pressed together by the small-diameter roller 21 and the backup roller 31. Unexposed microcapsules are ruptured under the applied pressure to thereby form an output image on the developer sheet 38 because of the reaction of chromogenic material with the developer material.

Both the microcapsule sheet 37 and the developer sheet 38 are fed out of the pressure developing unit 20. The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to thermal fixing in the thermal fixing unit 30 and is then discharged onto the discharge tray 27 with its image surface up. The microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 1) of the glass 2 confronts the light source, the copying of the original is completed and the halogen lamp 3 is turned off.

Another image recording apparatus will be described with reference to FIG. 2 in which like elements or units as those shown in FIG. 1 are denoted by like reference numerals.

An original support stand glass 2 and a stand cover 1 are provided in the upper portion of the apparatus 40' similar to the apparatus shown in FIG. 1. The original support stand glass 2 is bi-directionally movable in the directions A and B in accordance with an output from a driver unit (not shown). A slit 39 is formed on the upper surface of the apparatus 40' which slit 39 longitudinally extends in the direction perpendicular to the moving direction of the original support stand glass 2. A light source (halogen lamp) 3 and a semi-cylindrical reflector 4 are provided in the left side of an optical pass downwardly extending from the slit 39. Light emitted from the lamp 3 is irradiated onto an original 41 placed on the original support stand glass 2 through the slit 39. An exposure stand 19 is fixedly disposed below the slit 39 so that light emitted from the lamp 3 and reflected from the original 41 is focused thereon after passing through a lens 9.

A microcapsule sheet 37 is wound around a cartridge shaft 14 in a rolled state and is retained in a cartridge 13. A microcapsule sheet 37 is drawn out of a lower opening of the cartridge 13 and is conveyed rightwardly while passing immediately above the exposure stand 19. Downstream of the exposure stand 19 and above the microcapsule sheet feeding path, a developer sheet cassette 32 is disposed in which developer sheets 38 are stacked and the uppermost sheet 38 is fed out in accordance with the rotation of a sector roller 33. The developer sheet 38 thus fed out is superposed on the microcapsule sheet 37 while being guided by a guide path 42.

A pressure developing unit 20 is disposed rightwardly of the exposure stand 19 and below the developer sheet cassette 32, into which the superposed two sheets are fed. In downstream of the pressure developing unit 20, a pair of feed rollers are provided for feeding the sheets in rightward direction. In downstream of the feed rollers 22, a separation roller 23 is provided for separating the microcapsule sheet 37 from the developer sheet 38, and the former sheet is wound around a take-up shaft 25 and the latter sheet is discharged onto a discharge tray 27.

A filter unit 8 is disposed at the right side of the optical path and immediately below the upper plate of the apparatus 40', in which contained are a yellow filter 8a, a magenta filter 8b and a cyan filter 8c. The respective filters are horizontally extendable from an opening 81 provided in the left side portion of the filter unit 8.

Figure 2:
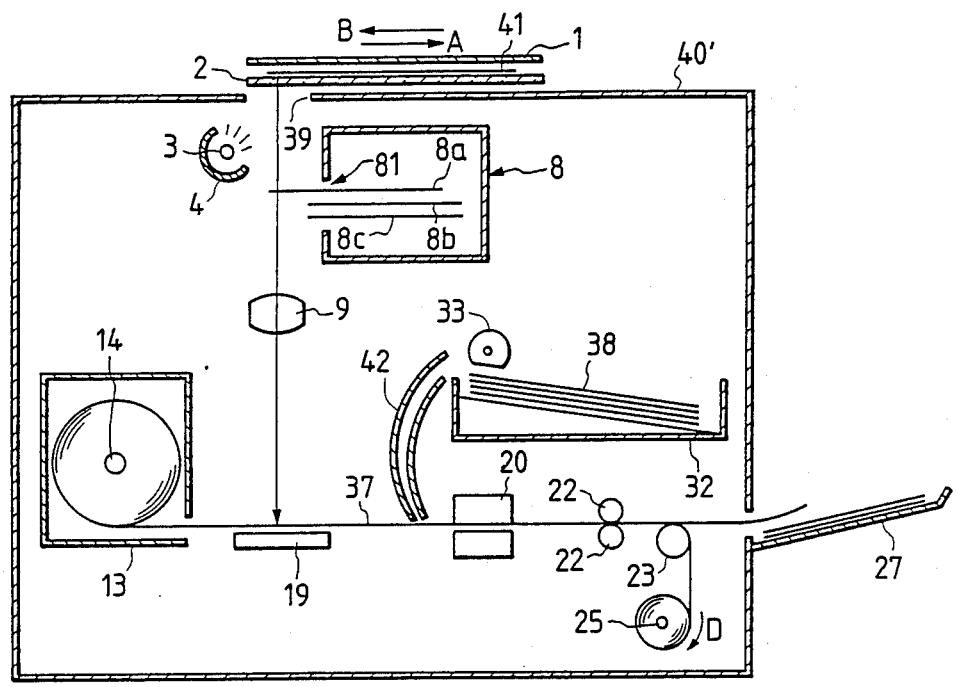
FIG. 2 is a schematic elevational view showing a second example of an image recording apparatus to which an exposure unit of the present invention is applied.
Figure 3:
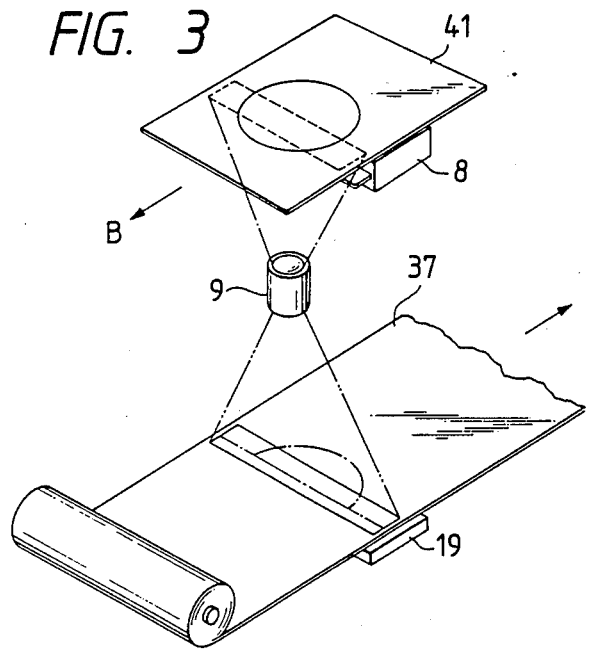
FIG. 3 is a perspective view showing an optical system incorporated in the apparatus shown in FIG. 2.
Figure 4:
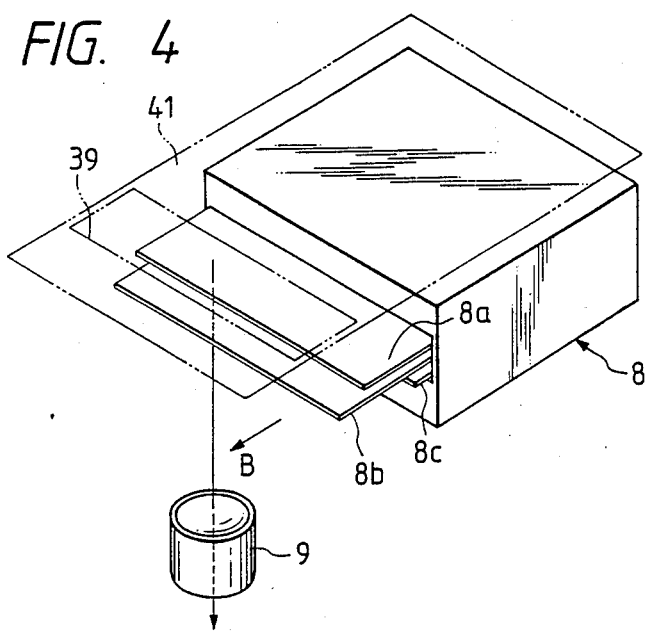
FIG. 4 is a perspective view showing an arrangement of a filter unit according to the present invention.
Figure 5:
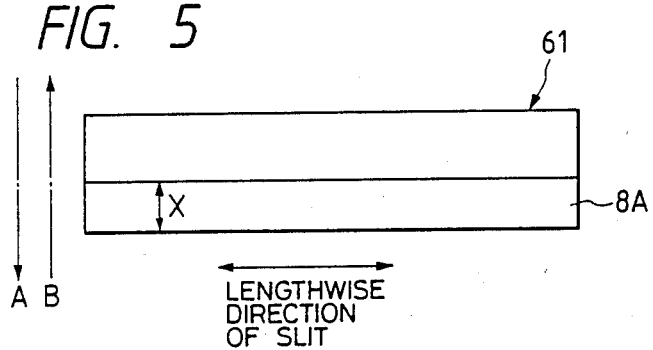
FIG. 5 is an explanatory diagram showing an operation of the filter unit shown in FIG. 4.

The apparatus in FIG. 2 similarly operates to the one shown in FIG. 1. Briefly, when a start button (not shown) is depressed, the original support stand glass 2 on which the original 41 is placed with image face down is moved rightwardly (in the direction indicated by the arrow A) and stops at a position where the leftmost portion of the original 41 is irradiated by the light emitted from the lamp 3. Then, the same is moved leftwardly. During the leftward movement of the glass 3, the image face of the original 41 is sequentially irradiated by the light through the slit 39. The light reflected from the original 41 transmits through the filters selectively drawn from the opening 81. The light further transmits through the lens 9 and is directed toward the microcapsule sheet 37 moving along the exposure stand 19 at a speed correlated with the moving speed of the original support stand glass 2. The microcapsule sheet 37 is thus exposed to an image bearing light and a latent image corresponding to the image of the original 41 is formed thereon. The microcapsule sheet 37 having the latent image formed thereon is further conveyed rightwardly by the feed rollers 22. In timed relation to the movement of the microcapsule sheet 37, the developer sheet 38 is fed out by the sector rollers 33 and is superposed on the latent image formed portion of the microcapsule sheet 37. The superposed two sheets are introduced into the pressure developing unit 20 to develop the latent image and provide a visible image on the developer sheet 38. After the pressure development, both sheets are separated by the separation roller 23 and the developer sheet 38 with the visible image thereon is discharged onto the discharge tray 27 and the exhausted microcapsule sheet 37 is wound around the take-up shaft.

Figure 6:
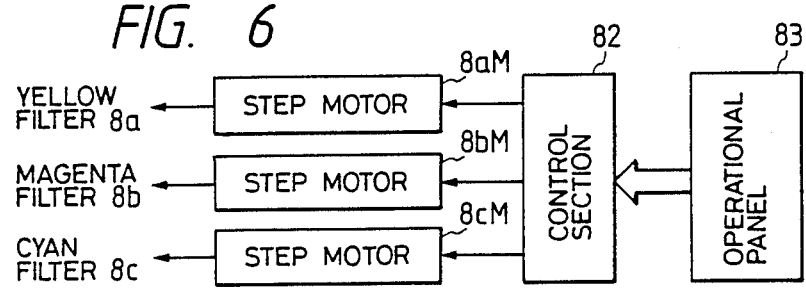
FIG. 6 is a block diagram showing one example of a filter unit driving system according to the present invention.

The filter unit 8 provided in the apparatuses shown in FIGS. 1 and 2 will be described in detail with reference to FIGS. 3 through 6. As shown in FIG. 6, the respective filters 8a, 8b and 8c are horizontally movable by the associated linear step motors 8aM, 8bM and 8cM, respectively. These motors are provided in the interior of the filter unit 8. More specifically, the linear step motors 8aM, 8bM and 8cM are connected to a control section 82 containing therein a CPU (central processing unit). The control section 82 supplies a control signal to each of the motors, and in response thereto displacement of a movable portion of the motor is controlled. The control section 82 is connected to an operation panel 83 which serves as a machine interface between an operator and the control section 82. The position of each of the filters is moved through the manipulation of the operation panel 83. The filter is movably disposed in a plane perpendicular to the light path.

Next, the color correction or adjustment by the filter unit 8 will be described. In the case where the image formed on the developer sheet 38 is bluish compared with the color of the original, it is required that the blue-color component be eliminated or reduced to some extent. To this effect, the operation panel 83 is manipulated so that the yellow filter 8a is drawn into the optical path. When the original support stand glass 2 moves at a speed v and the yellow filter 8a is drawn or inserted into the optical path for the amount of x (see FIG. 5), the microcapsule sheet 37 is exposed to light having passed through the yellow filter 8a for a period of time x/v and thereafter exposed to light not having passed therethrough for a period of time (W-x)/v, in which W is the width of the slit 39 perpendicular to the moving direction of the original support stand glass 2. This means that the microcapsule sheet 37 is exposed to both the red-color and green-color light components for the period of time W/v, and by the blue-color light component for the period of time x/v. That is, the exposure by the blue-color light component is suppressed. As a result, the intended color correction is accomplished. While description has been described with respect to the color correction of blue, the color correction can be carried out as desired provided that the amount of movement or insertion of one or more of the filters are adjusted.

Next, referring to FIGS. 7 and 8A through 8C, description will be made with respect to another embodiment of the filter unit.

The filter unit 8 includes, similar to the foregoing embodiment, three filters 8a, 8b and 8c for adjusting three primary colors. These filters 8a, 8b and 8c are suspended by filter frames 101a, 101b and 101c are provided with rack portions 101aa, 101bb, and 101cc at one side end thereof, respectively. The frames 101a, 101b and 101c have a through-hole into which a filter guide rods 102a, 102b and 102c are respectively inserted, and the frames are slidably movably supported thereon. Each of the filters are biased by means of a biasing spring (not shown) in a direction indicated by an arrow C and are placed in a retracted position offset from the optical path.

At the side portion of the filter frames 101a, 101b and 101c, there are provided a first sector gear 109a and a second sector gear 109b. The first sector gear 109a selectively threadingly engages one of the rack portions 101aa, 101bb. The second sector gear 109b selectively threadingly engages one of the rack portions 101b and 101cc. The first sector gear 109a has a gear 108a, a first filter drive gear 108aa, and a second filter drive gear 108ab. The second sector gear 109b has a gear 108b and a third filter drive gear 108bb and a fourth filter drive gear 108bc. The first filter drive gear 108aa of the first sector gear 109a threadingly engages the rack portion 101aa. The second filter drive gear 108ab of the first sector gear 109a threadingly engages the rack portion 101bb. The third filter drive gear 108bb of the second sector gear 109b threadingly engages the rack portion 101bb and the fourth filter drive gear 108bc threadingly engages the rack portion 109cc. Both the first and second filter drive gears 108aa and 108ab of the first sector gear 109a are configured to a sector shape so that the threading engagements of these gears with the rack portions 101aa and 101bb are timingly delayed with each other. That is, these two gears 108aa and 108ab are not simultaneously threadingly engaged with the rack portions 101aa and 101bb, respectively. The third and fourth filter drive gears 108bb and 108bc of the second sector gear 109b are also configured to a sector shape so that these two gears 108bb and 108bc are not simultaneously threadingly engaged with the rack portions 101bb and 101cc, respectively.

A drive motor 103a is provided for rotating the first sector gear 109a. Idler gears 106a and 107a are interposed between the motor 103a and the first sector gear 109a. The idle gear 106a rotates about a shaft 104a while another idler gear 107a rotates about another shaft 104b.

The sector gear 109a rotates about a shaft 104c. The shafts 104a, 104b and 104c are fixedly secured to a filter chassis (not shown). Another drive motor 103b is provided for rotating the second sector gear 109b, and idler gears 106b and 107 are interposed between the second sector gear 109b and the drive motor 103b. The idler gear 106b rotates about the shaft 104a while the idler gear 107b rotates about the shaft 104b. The sector gear 109b rotates about the shaft 104c. Drive power from the motor 103a is transmitted via the idler gears 106a and 107a to the gear 108a while the drive power from the motor 103b is transmitted via the idler gears 106b and 107b to the gear 108b. A spacer 105 is interposed in axial direction between the idle gears 106a and 106b to give a predetermined interval therebetween. A position sensor (not shown) is provided in the vicinity of the frame 101b for sensing that the filter frame 101b has reached a predetermined position in the optical path.

Next, the operation of the filter unit 8 thus constructed will be described. Color tone adjustment, which is carried out before start of image recordation, is performed in such a manner that two out of three filters 8a, 8b and 8c are selectively drawn from the opening of the filter unit 8 by certain distances. In order to compute the distance that each of the filters is moved, an origin detection for the motors 103a and 103b is separately carried out.

When the motor 103a is driven, the rotations of the motor 103a are transmitted via the idler gears 106a, 107a and the gear 108a to the first sector gear 109a, so that selective one of the filter frames 101a and 101b is moved along the associated rod 102a or 102b in the direction opposite to the direction indicated by the arrow C against the biasing force. Under the condition that the filter drive gear 108aa is in threading engagement with the rack portion 101aa of the filter frame 101a as shown in FIG. 8A, continuous driving of the motor 103a results in disengagement of the gear 108aa from the rack portion 101aa, since the gear 108aa is of a sector shape. As a result, due to the biasing spring, the filter frame 101a is moved back to a direction indicated by the arrow C and is retracted to a rest position (not shown). Further rotation of the motor 103a brings the gear 108ab into threading engagement with the rack portion 101bb of the filter frame 101b as shown in FIG. 3C so that the filter frame 101b is moved toward the optical path. The fact that the filter frame 101b has reached a predetermined position in the optical path is sensed by the sensor. From this state, the sector gear 109a is rotated by a predetermined angle to return the sector gear 109a to the original state shown in FIG. 8A, whereupon the driving of the motor 103a is stopped and this state is set as an original of the motor 103a. In the course of returning to the original state, the filter drive gear 108ab is disengaged from the rack portion 101bb, so that the filter frame 101b is retracted to the rest position as in the case of the filter frame 101a.

Next, the motor 103b is driven to rotate the second sector gear 109b from the state shown in FIG. 8A to the state where the gear 109b is brought to a state shown in FIG. 8C. After the sensor senses the fact that the filter frame 101b has reached to the predetermined position, the second sector gear 109b is further rotated by the predetermined angle to have the gear 109b return to the state shown in FIG. 8A. The motor 103b is then stopped and this state is set as an origin of the motor 103b.

In order to perform the color tone adjustment or correction, it is not necessary that the three filters 8a, 8b and 8c be drawn out all together. Selectively, two filters may be drawn out, and depending upon the case one filter would suffice. Accordingly, two filters appropriately selected from the three filters are drawn into the optical path while driving the motors 103a and 103b for a predetermined amount.

Referring to FIGS. 9 through 13, another embodiment of the exposure unit according to the present invention will be described. In the exposure units to be described later, exposure takes place not only by the light reflected from the original but also by an auxiliary exposure light. The auxiliary exposure is necessary when using a photosensitive pressure-sensitive recording medium as disclosed in U.S. Pat. No. 4,339,209. Because gradation reproducibility is insufficient if such a recording medium is exposed only to the light reflected from the original.

Figure 9:
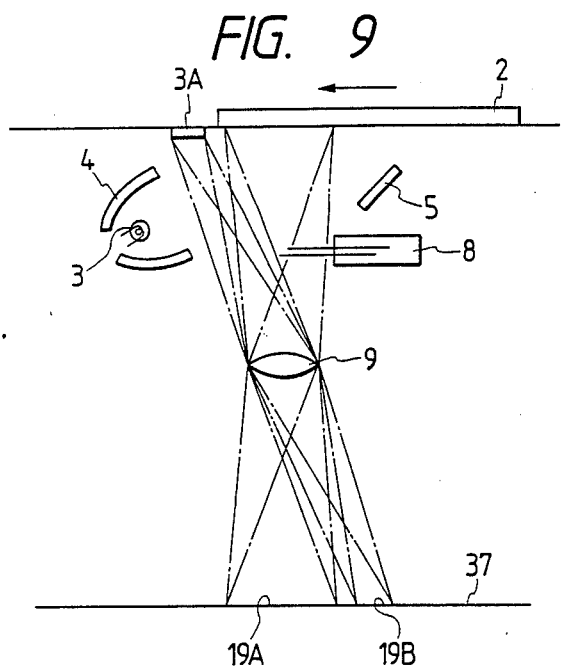
FIG. 9 is a schematic elevational view showing one example of an exposure unit according to the present invention in which an auxiliary exposure plate is used.
Figure 10:
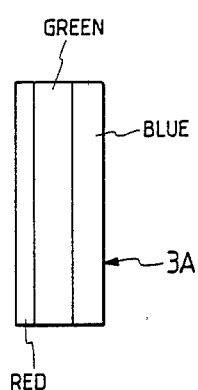
FIG. 10 is a plan view showing the auxiliary exposure plate shown in FIG. 9.

In the embodiment shown in FIG. 9, a halogen lamp 3 and a reflector 4 are disposed in left side with respect to an optical path, and a reflector 5 is disposed in right side with respect thereto. A filter unit 8 and a lens 9 are arranged in the similar fashion as in the foregoing embodiment shown, for example, in FIG. 2. Designated by reference numeral 3A is an auxiliary exposure plate, which is in the form of a plate as shown in FIG. 10. The surface of the plate-like auxiliary exposure plate 3A has a red-color region, a green-color region and a blue-color region.

Figure 11:
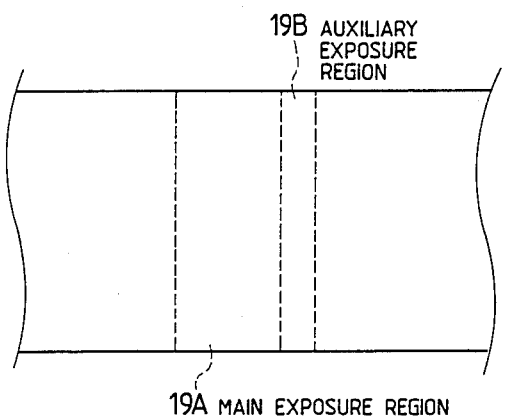
FIG. 11 is a diagram showing an exposing condition by the exposure unit shown in FIG. 9.

In operation, an original support stand glass 2 moves leftwardly as indicated by an arrow and during the leftward movement of the stand glass 2, light emitted from the halogen lamp 2 is irradiated onto the original to sequentially scan the entire image face of the original placed on the stand glass 2. More specifically, the light from the lamp 3 is directed not only to the original but also to the auxiliary exposure plate 3A, and the light reflected from the original passes through filters drawn from the filter unit 8 and is focused by the lens 9. The resultant light is applied to a microcapsule sheet 37. At the same time, the light reflected from the auxiliary exposure plate 3A is directly applied thereto. The surface of the microcapsule sheet 37 is illustrated in FIG. 11, in which the exposed area is made up of a main exposure region 19A and an auxiliary exposure region 19B. The light components applied to the main exposure region 19A have been adjusted by the filters and a desirable color reproduction is thereby attainable. On the other hand, the light components applied to the auxiliary exposure region 19B are not subjected to color adjustment by the filter unit 8 but dependent only upon the color distribution on the auxiliary exposure plate 3A. That is, the auxiliary light components are determined independently of the light components of the main exposure.

As the original support stand glass 2 moves leftwardly, the microcapsule sheet 37 moves rightwardly in timed relation to the movement of the stand glass 2. When the movement of the stand glass 2 has terminated, a latent image is formed on the microcapsule sheet 37. The latent image formed thereon exhibits good reproducibility and good color-tone gradation.

Figure 12:
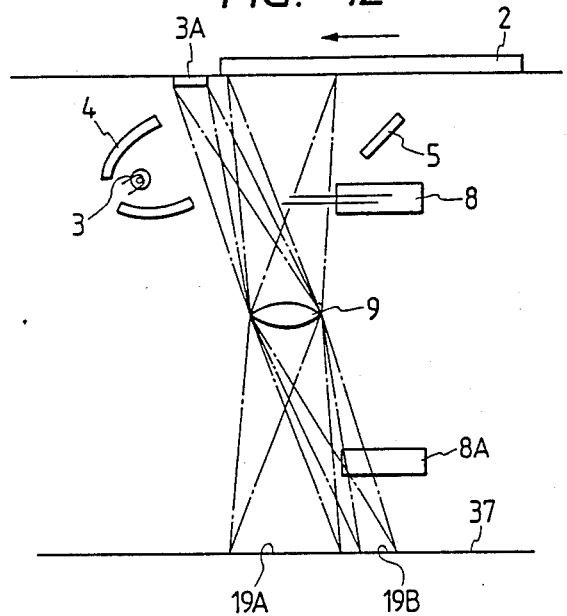
FIGS. 12 and 13 are schematic elevational views showing another examples of the exposure unit according to the present invention in which an auxiliary exposure plate is used.

FIG. 12 is a modification of the exposure unit shown in FIG. 9. In this modification, the auxiliary exposure plate 3A is not colored as shown in FIG. 10 but a white plate or a mirror is employed. Instead, another filter unit 8A is provided for allowing to pass only the light from the auxiliary exposure plate 3A.

Figure 13:
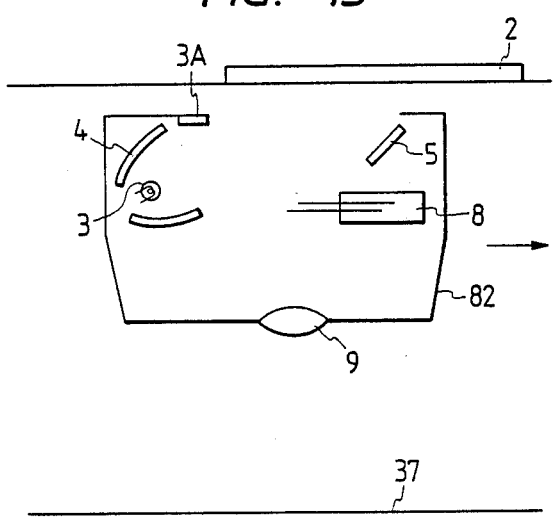

FIG. 13 is another modification of the exposure unit. In this modification, an exposure unit including a lamp 3, reflectors 3 and 5, a filter unit 8, a lens 9, and an auxiliary exposure plate 3A are movable disposed within an image recording apparatus. And, an original support stand glass 2 and a microcapsule sheet 37 are held stationary.

Figure 7:
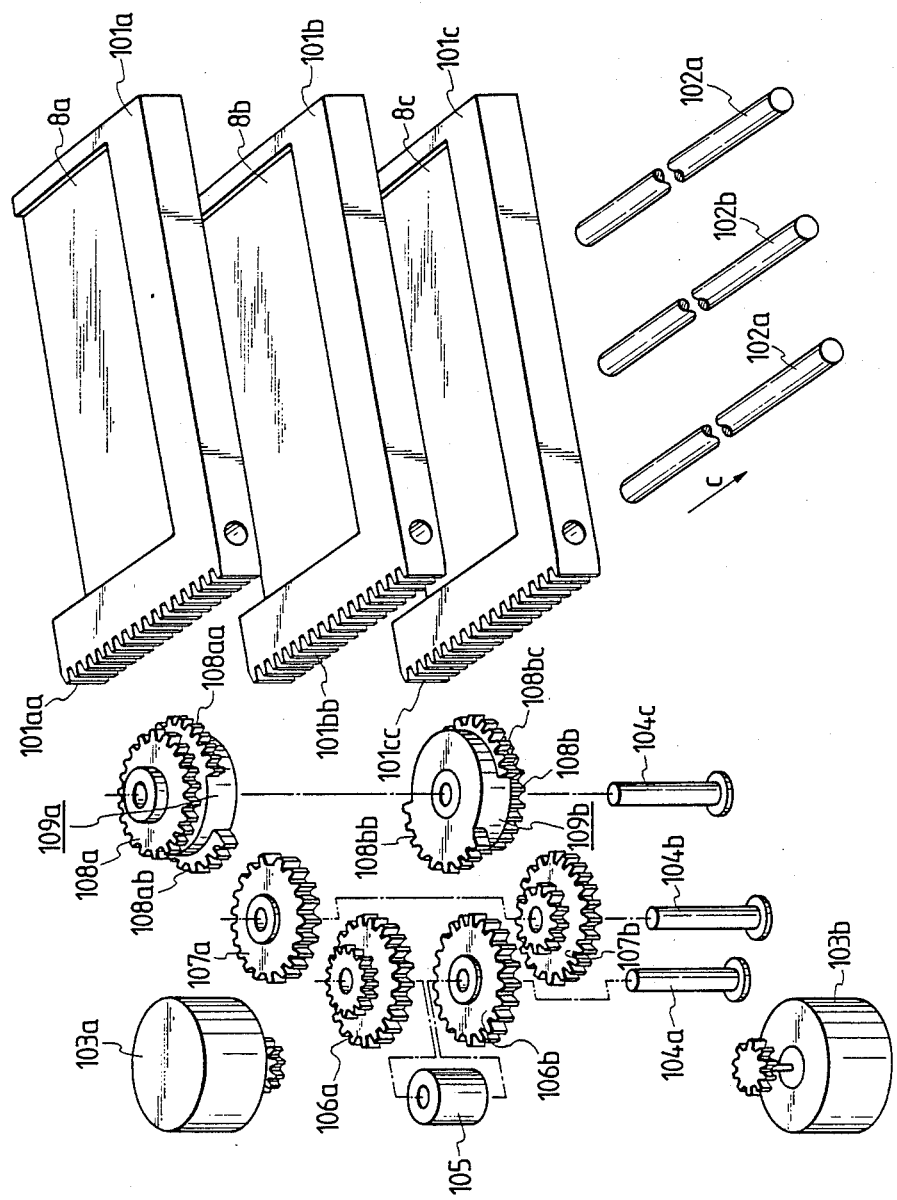
FIG. 7 is a fragmentary perspective view showing another example of a filter unit driving system according to the present invention.

While the invention has been described with reference to specific embodiments thereof, it would be apparent for those skilled in the art that various changes and modifications can be made therein without departing from the spirit and scope of the invention. For example, although the drive motors 103a and 103b shown in FIG. 7 are arranged symmetrically with respect to a horizontal line, these motors may be arranged so that one motor is reversed by 180 degrees. In such a case, it may be necessary to interpose an additional gear between the motor and the first idle gear to transmit the driving power. If such is done, the thickness of the filter unit can be reduced.

What is claimed is:

1. An exposure unit for use in an image recording apparatus for exposing a substrate to a light, said exposure unit comprising:
   a filter unit for receiving a first light passing along an optical path and adjusting light components contained in said first light, said filter unit including:
   (a) a light source for emitting said first light;
   (b) a filter housing to which an opening is formed;
   (c) a first filter member for adjusting a red-color light component;
   (d) a second filter member for adjusting a blue-color light component; and
   (e) a third filter member for adjusting a green-color light component, wherein said first, second and third filter members are retained in said filter housing and adapted to be drawn from said opening,
   a drive unit for selectively drawing said first, second and third filter members from said opening into the optical path, said drive unit comprising:
   an operation panel for outputting a color adjusting signal, said signal instructing adjustment of the color components of said first light;
   a controller connected to said operation panel for supplying first, second and third drive signals in response to the color adjusting signal;
   a first motor responsive to said first drive signal for moving said first filter member, said first filter member being moved by a first distance depending upon said first drive signal;
   a second motor responsive to said second drive signal for moving said second filter member, said second filter member being moved by a second distance depending upon said second drive signal; and
   a third motor responsive to said third drive signal for moving said third filter member, said third filter member being moved by a third distance depending upon said third drive signal.

2. An exposure unit as defined in claim 1, further comprising an auxiliary color adjusting member for emitting a second light having a predetermined light components, wherein said substance is directly exposed to said second light.

3. An exposure unit as defined in claim 2, wherein said auxiliary color adjusting member is a plate having thereon a red-color region, a green-color region and a blue-color region.

4. An exposure unit as defined in claim 2, wherein said auxiliary color adjusting member comprises a white plate for emitting a white light and a filter for adjusting light components of said white light.

5. An exposure unit as defined in claim 2, wherein said auxiliary color adjusting member comprises a mirror for emitting a white light and a filter for adjusting light components of said white light.

6. An exposure unit as defined in claim 2, wherein a first portion of said substrate is exposed to said first light and a second portion of said substrate is exposed to said second light.

7. An exposure unit for use in an image recording apparatus for exposing a substrate to a light, said exposure unit comprising:
   a filter unit for receiving a first light passing along an optical path and adjusting light components contained in said first light, said filter unit including:
   (a) a light source for emitting said first light;
   (b) a filter housing to which an opening is formed;
   (c) a first filter member for adjusting a red-color light component;
   (d) a second filter member for adjusting a blue-color light component; and
   (e) a third filter member for adjusting a green-color light component, wherein said first, second and third filter members are retained in said filter housing and adapted to be drawn from said opening,
   a drive unit for selectively drawing said first, second and third filter members from said opening into the optical path;
   a first gear member having a first portion engageable with said first filter member and a second portion engageable with said second filter member, said first and second portions being selectively engageable with said first and second filter members, respectively;
   a second gear member having a third portion engageable with said second filter member and a fourth portion engageable with said third filter member, said third and fourth portions being selectively engageable with said second and third filter members, respectively;
   a fourth motor for driving said first gear member; and
   a fifth motor for driving said second gear member, and
   a lens unit disposed downstream of the filter unit for receiving and focusing said light, wherein said substrate is exposed to said first light being thus focused.

8. An exposure unit as defined in claim 7, further comprising an auxiliary color adjusting member for emitting a second light having a predetermined light components, wherein said substrate is directly exposed to said second light.

9. An image recording apparatus for recording an image of an original on an image recording medium having an imaging surface capable of forming a latent image thereon when exposed to light, said apparatus comprising:
   a light source for emitting light;
   an original support unit for supporting said original so as to be irradiated by the light emitted from said light source, said original support unit being movable at a predetermined speed so that the image of said original is sequentially scanned by the light, the light irradiated onto said original being reflected from said original and providing an image bearing light passing along an optical path;
   a conveying unit for conveying said image recording medium along a conveyance path;
   an exposure unit having an exposure zone along which said image recording medium is conveyed wherein said image bearing light is applied to said image recording medium to form a latent image thereon, wherein said exposure unit comprises:
   (a) a filter unit for receiving said image bearing light and adjusting light components contained in said image bearing light, said filter unit having a filter housing to which an opening is formed, a first filter member for adjusting a red-color light component, a second filter member for adjusting a blue-color light, and a third filter member for adjusting a green-color light component, said first, second and third filter members being retained in said filter housing and adapted to be drawn from said opening; a drive unit for selectively drawing said filter members from said opening into the optical path; and
   (b) a lens unit for receiving the image bearing light and focusing the latter light
   a developing unit disposed downstream of said exposure unit and having a developing zone for developing said latent image and providing a visible image; and
   a drive unit for moving said first filter member, a second filter member and a third filter member, wherein said driving unit comprises:
   a first gear member having a first portion engageable with said first filter member and a second portion engageable with said second filter member, said first and second portions being selectively engageable with said first and second filter members;
   a second gear member having a third portion engageable with said second filter member and a fourth portion engageable with said third filter member, said third and fourth portions being selectively engageable with said second and third filter members;
   a first motor for driving said first gear member; and
   a second motor for driving said second gear member.

10. An image recording as defined in claim 9, wherein said image recording medium comprises a first image recording medium and a second image recording medium, said first image recording medium comprising a photosensitive pressure-sensitive recording medium provided with microcapsules, said microcapsules encapsulating therein a first material having first and second phases dependent on light exposure, and said second image recording medium comprising a developer medium provided with a second material which provides an output image upon reaction with said first material.

11. An image recording apparatus as defined in claim 10, wherein said first material comprises a chromogenic material selected from the colors comprising cyan, yellow, and magenta wherein said first filter member causes to vary the cyan chromogenic material from said first phase to said second phase, said second filter member causes to vary the yellow chromogenic material from said first phase to said second phase, and said third filter member causes to vary the magenta chromogenic material from said first phase to said second phase.

12. An image recording apparatus as defined in claim 11, wherein said first, second, and third filter members are arranged in vertical direction in which the recording apparatus is oriented in a direction in which it is used.

13. An image recording apparatus as defined in claim 12, further comprising an auxiliary color adjusting member disposed in a position to receive said light emitted from said light source for adjusting light components of said light, said auxiliary color adjusting member providing color adjusted light, and said color adjusted light being passed through said lens unit and applied to a first region on said first recording medium different from a second region thereon to which the image bearing light is applied.

14. An image recording apparatus as defined in claim 13, wherein said auxiliary color adjusting member is a plate-like member having thereon a red-color region, a green-color region, and a blue-color region for emitting red-color, green-color and blue-color, respectively.

15. An image recording apparatus as defined in claim 13, wherein said auxiliary color adjusting member is a white plate for emitting a white light, and further comprising an auxiliary filter member for allowing to pass only said white light.

16. An image recording apparatus as defined in claim 13, wherein said auxiliary color adjusting member is a mirror for emitting a white light, and further comprising an auxiliary filter member for allowing to pass only said white light.

* * * * *